(12) United States Patent
Chiang

(10) Patent No.: US 11,764,340 B2
(45) Date of Patent: Sep. 19, 2023

(54) MICRO LED DISPLAY DEVICE AND MANUFACTURING METHOD THEREOF

(71) Applicants: Interface Technology (ChengDu) Co., Ltd., Sichuan (CN); Interface Optoelectronics (ShenZhen) Co., Ltd., Guangdong (CN); Interface Optoelectronics (Wuxi) Co., Ltd., Jiangsu (CN); General Interface Solution Limited, Miaoli County (TW)

(72) Inventor: Che-Wen Chiang, Guangdong (CN)

(73) Assignees: Interface Technology (ChengDu) Co., Ltd., Sichuan (CN); Interface Optoelectronics (ShenZhen) Co., Ltd., Guangdong (CN); Interface Optoelectronics (Wuxi) Co., Ltd., Jiangsu (CN); General Interface Solution Limited, Miaoli County (TW)

( * ) Notice: Subject to any disclaimer, the term of this patent is extended or adjusted under 35 U.S.C. 154(b) by 154 days.

(21) Appl. No.: 17/210,484

(22) Filed: Mar. 23, 2021

(65) Prior Publication Data
US 2022/0216381 A1    Jul. 7, 2022

(30) Foreign Application Priority Data
Jan. 4, 2021    (CN) .......................... 202110003650.1

(51) Int. Cl.
*H01L 25/075*    (2006.01)
*H01L 33/54*    (2010.01)
*H01L 27/15*    (2006.01)
*H01L 33/00*    (2010.01)
*H01L 33/50*    (2010.01)

(52) U.S. Cl.
CPC ............ *H01L 33/54* (2013.01); *H01L 27/156* (2013.01); *H01L 33/005* (2013.01); *H01L 33/502* (2013.01); *H01L 2933/005* (2013.01)

(58) Field of Classification Search
CPC .......................... H01L 33/505; H01L 25/0753
USPC .......................................................... 257/98
See application file for complete search history.

(56) References Cited

U.S. PATENT DOCUMENTS

| | | | | |
|---|---|---|---|---|
| 2001/0026668 | A1* | 10/2001 | Yamada | G02B 6/1225 385/125 |
| 2016/0372514 | A1* | 12/2016 | Chang | G09G 3/2003 |
| 2019/0103584 | A1* | 4/2019 | Chen | H01L 51/5246 |
| 2020/0166767 | A1* | 5/2020 | Qin | G02B 6/005 |
| 2020/0335667 | A1* | 10/2020 | Deckers | F21S 41/153 |

* cited by examiner

*Primary Examiner* — Hsin Yi Hsieh
(74) *Attorney, Agent, or Firm* — CKC & Partners Co., LLC

(57) ABSTRACT

A micro light emitting diode (LED) display device includes a substrate, micro LED dies, a protection layer, and a funnel-tube structure array. The micro LED dies are located on the substrate. The protection layer covers the micro LED dies and the substrate. The funnel-tube structure array is located on the protection layer and includes funnel-tube structures. Each of the funnel-tube structures has a top surface facing away from the protection layer. The funnel-tube structures respectively overlap the micro LED dies in a vertical direction, and widths of the funnel-tube structures are gradually increased from the protection layer to the top surfaces of the funnel-tube structures.

20 Claims, 14 Drawing Sheets

MICRO LED DISPLAY DEVICE AND MANUFACTURING METHOD THEREOF

CROSS-REFERENCE TO RELATED APPLICATION

This application claims priority to China Application Serial Number 202110003650.1, filed Jan. 4, 2021, which is herein incorporated by reference.

BACKGROUND

Field of Invention

The present disclosure relates to a micro light emitting diode (LED) device and a method of manufacturing the micro LED display device.

Description of Related Art

Micro light emitting diodes (LEDs) have advantages of display techniques of liquid crystal displays and organic LEDs, and can be considered as a display technique of the latest generation. The type of light field of micro LEDs is typically a Lambertian distribution. Thus, micro LEDs applied in image display devices require additional structures for collocation, such as color conversion layer, optical fiber coupler, lens array, etc.

Color conversion layer converts light from blue micro LEDs to red, green, and blue lights (i.e., three primary colors). Given that only blue light micro LEDs are used, a greatest NTSC standard from mixing red, green, and blue light cannot be achieved. Additionally, optical fiber coupler couples red, green, and blue light into a same optical fiber, but the related technical difficulty and fabrication cost are high. Furthermore, each micro LED of the lens array needs to be configured to a corresponding lens, using the lens to restrict the wide angle light of the micro LED so as to achieve the desired type of light field. This fabrication method has a high cost and is difficult to achieve light uniformity.

Most current micro LED display devices are in research and development stages. Achieving mass production standard for these display and fabrication techniques is a significant challenge.

SUMMARY

An aspect of the present disclosure provides a micro light emitting diode (LED) display device.

According to some embodiments of the present disclosure, a micro LED display device includes a substrate, a plurality of LED dies, a protection layer, and a funnel-tube structure array. The plurality of micro LED dies are located on the substrate. The protection layer covers the micro LED dies and the substrate. The funnel-tube structure array is located on the protection layer, and includes a plurality of funnel-tube structures. Each of the funnel-tube structures has a top surface facing away from the protection layer. The funnel-tube structures respectively overlap the micro LED dies in a vertical direction, and widths of the funnel-tube structures are gradually increased from the protection layer to the top surfaces of the funnel-tube structures.

In some embodiments of the present disclosure, each of the funnel-tube structures has a sloped edge, an acute angle is included between the sloped edge and the protection layer, and the acute angle is in a range from 45 degrees to 85 degrees.

In some embodiments of the present disclosure, a material of the funnel-tube structures includes negative photoresist.

In some embodiments of the present disclosure, the micro LED dies include a red micro LED die, a green micro LED die, and a blue micro LED die, the funnel-tube structures are transparent and have a refractive index in a range from 1.5 to 2.

In some embodiments of the present disclosure, the micro LED dies are blue micro LED dies, and the funnel-tube structures include a red photoresist, a green photoresist, and a blue photoresist.

In some embodiments of the present disclosure, wherein a material of the funnel-tube structures includes titanium dioxide or quantum dots.

In some embodiments of the present disclosure, areas of the top surfaces of the funnel-tube structures are greater than areas of bottom surfaces of the funnel-tube structures.

In some embodiments of the present disclosure, lengthwise axes of the funnel-tube structures respectively pass through centers of the micro LED dies.

In some embodiments of the present disclosure, the funnel-tube structures directly contact the protection layer.

In some embodiments of the present disclosure, the protection layer is located between the funnel-tube structures and the micro LED dies.

Another aspect of the present disclosure provides a method of manufacturing a micro LED display device.

According to some embodiments of the present disclosure, a method of manufacturing a micro LED display device includes: disposing a plurality of micro LED dies on a substrate; forming a protection layer covering the micro LED dies and the substrate; and forming a funnel-tube structure array having a plurality of funnel-tube structures on the protection layer, wherein the funnel-tube structures respectively overlap the micro LED dies in a vertical direction, and widths of the funnel-tube structures are gradually increased from the protection layer to top surfaces of the funnel-tube structures.

In some embodiments of the present disclosure, forming the funnel-tube structure array on the protection layer includes: forming a negative photoresist on the protection layer; exposing the negative photoresist to ultraviolet light; and etching the negative photoresist to form the funnel-tube structure array.

In some embodiments of the present disclosure, exposing the negative photoresist to ultraviolet light includes: passing the ultraviolet light through a plurality of translucent regions of a photomask, wherein the translucent regions respectively align with the micro LED dies in a vertical direction, and a width of each of the translucent regions is greater than or equal to a width of each of the micro LED dies.

In some embodiments of the present disclosure, the method of manufacturing the micro LED display device further includes placing the photomask near a top surface of the negative photoresist.

In some embodiments of the present disclosure, etching the negative photoresist is performed such that the negative photoresist has a sloped edge, and an acute angle is included between the sloped edge and the protection layer.

In some embodiments of the present disclosure, forming the funnel-tube structure array on the protection layer includes: forming a positive photoresist on the protection layer; exposing the positive photoresist to ultraviolet light; etching the positive photoresist to form a plurality of openings above the micro LED dies; and forming a filling material in the openings of the positive photoresist to form the funnel-tube structure array.

In some embodiments of the present disclosure, exposing the positive photoresist to ultraviolet light includes passing the ultraviolet light through a plurality of translucent regions of a photomask, wherein the translucent regions respectively align with the micro LED dies in a vertical direction, and a width of each of the translucent regions is greater than or equal to a width of each of the micro LED dies.

In some embodiments of the present disclosure, the method of manufacturing the micro LED display device further includes placing the photomask near a top surface of the positive photoresist.

In some embodiments of the present disclosure, the method of manufacturing the micro LED display device further includes after forming the filling material in the openings of the positive photoresist, removing the positive photoresist.

In some embodiments of the present disclosure, etching the positive photoresist is performed such that the positive photoresist has a sloped edge, and an obtuse angle is included between the sloped edge and the protection layer.

In the aforementioned embodiments of the present disclosure, since the micro LED display device has the funnel-tube structure located on the protection layer, and the width of the funnel-tube structure is gradually increased from the protection layer to the top surface of the funnel-tube structure, when the micro LED die under the funnel-tube structure emits light, the light emitted by the micro LED die can enter the funnel-tube structure and be totally internally reflected at the sloped edge of the funnel-tube structure. As a result, a light emitting efficiency of the micro LED display device can be increased, and light at a wide angle from the micro LED die can be restricted, thereby achieving a desired type of light field and facilitating a light uniformity of the micro LED display device.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
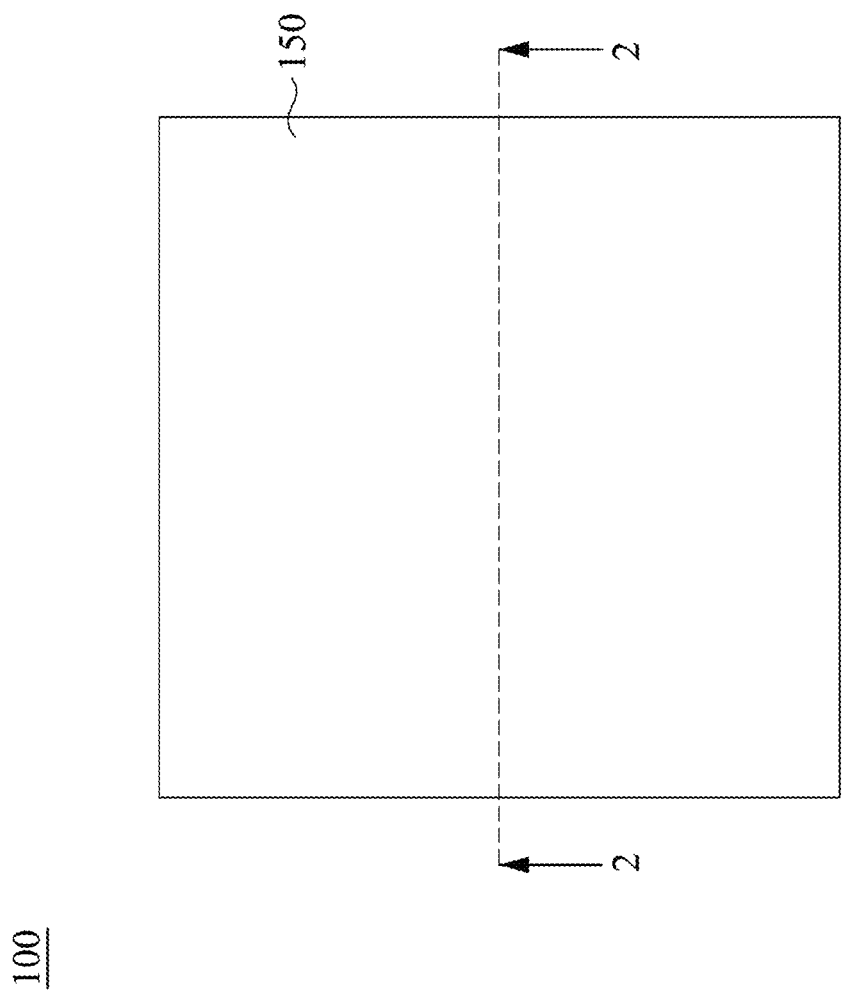
FIG. 1 shows a top view of a micro light emitting diode (LED) display device according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
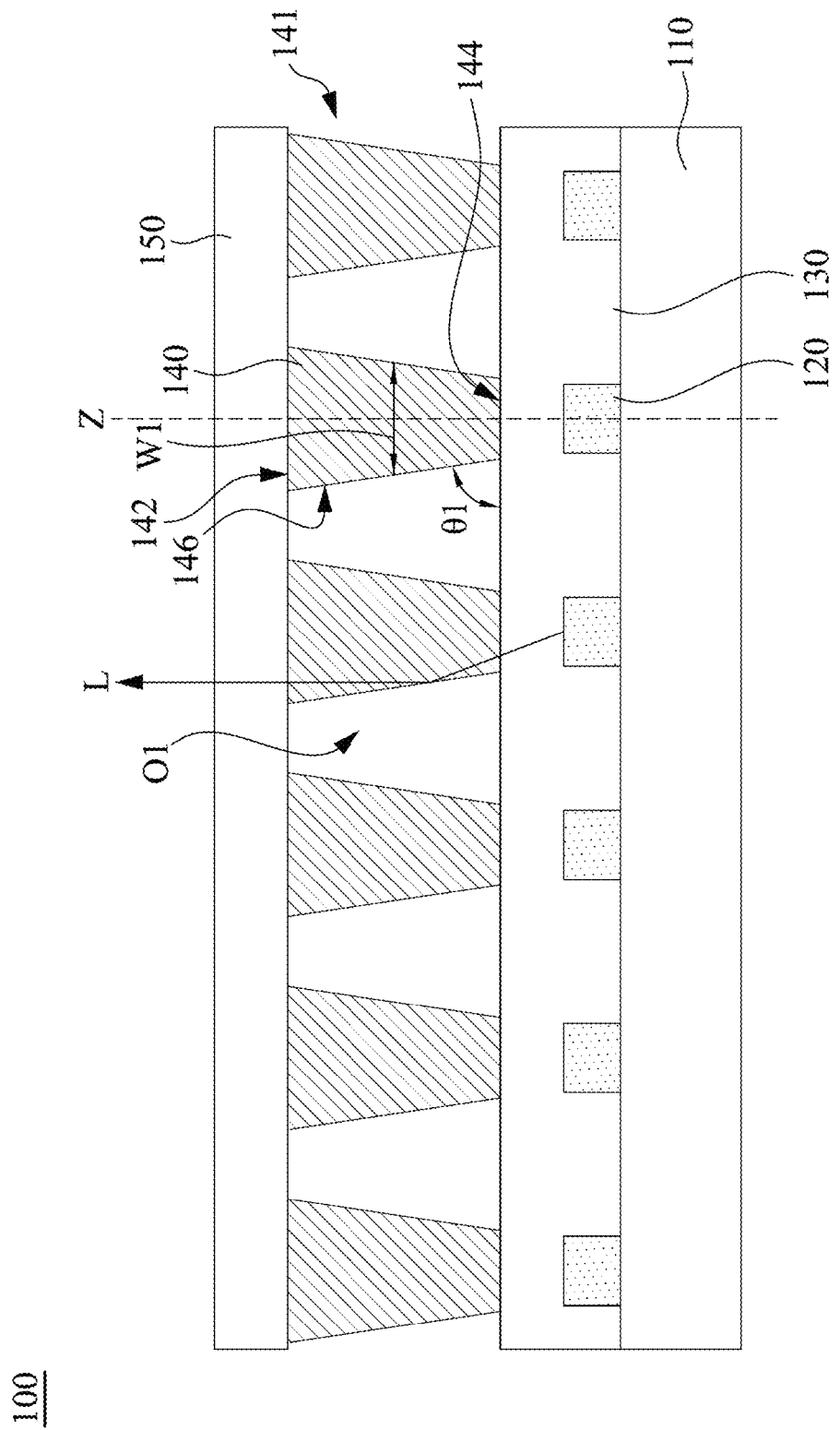
FIG. 2 shows a cross-sectional view of the micro LED display device of FIG. 1 along a line 2-2.

FIG. 1 shows a top view of a micro light emitting diode (LED) display device 100 according to embodiments of the present disclosure. FIG. 2 shows a cross-sectional view of the micro LED display device 100 of FIG. 1 along a line 2-2. Referring to FIG. 1 and FIG. 2, the micro LED display device 100 includes a substrate 110, a plurality of micro LED (μLED) dies 120, a protection layer 130, and a funnel-tube structure array 141 having a plurality of funnel-tube structures 140. The micro LED dies 120 are located on the substrate 110. The micro LED dies 120 can be red, green, or blue micro LED dies, and the die arrangement is not limited in the present disclosure. The substrate 110 may have a transistor and an electrode to light up the micro LED dies 120. The protection layer 130 covers the micro LED dies 120 and the substrate 110. A material of the protection layer 130 may be transparent acrylic adhesive, but is not limited thereto. The protection layer 130 can prevent the underlying micro LED dies 120 and conductive lines from being corroded.

The funnel-tube structure array 141 is located on the protection layer 130. The funnel-tube structure 140 has a refractive index greater than the refractive index of the micro LED die 120. The micro LED die 120 has a refractive index greater than the refractive index of the protection layer 130. The funnel-tube structure 140 has a top surface 142 facing away from the protection layer 130, and a bottom surface 144 facing toward the protection layer 130. The funnel-tube structures 140 respectively overlap the micro LED dies 120 in a vertical direction, and a width W1 of the funnel-tube structure 140 is gradually increased from the protection layer 130 toward the top surface 142 of the funnel-tube structure 140. In other words, the funnel-tube structure 140 has a sloped edge 146, and an area of the top surface 142 of the funnel-tube structure 140 is greater than an area of the bottom surface 144 of the funnel-tube structure 140. For example, a radius of the top surface 142 is in the range from 3 μm to 30 μm, a radius of the bottom surface 144 is in the range from 0 μm to 15 μm, a height of the funnel-tube structure 140 is in the range from 3 μm to 10 μm. Additionally, an acute angle θ1 is included between the sloped edge 146 of the funnel-tube structure 140 and the protection layer 130. In some embodiments, the acute angle θ1 between the sloped edge 146 of the funnel-tube structure 140 and the protection layer 130 may be in the range from 45 degrees to 85 degrees, thereby facilitating total internal reflection (TIR) inside the funnel-tube structure 140.

Since the micro LED display device 100 has the funnel-tube structure 140 located on the protection layer 130, and the width W1 of the funnel-tube structure 140 is gradually increased from the protection layer 130 to the top surface 142 of the funnel-tube structure 140, when the micro LED die 120 under the funnel-tube structure 140 emits light, the light L emitted by the micro LED die 120 can enter the funnel-tube structure 140 and be totally internally reflected at the sloped edge 146 of the funnel-tube structure 140. As a result, a light emitting efficiency of the micro LED display device 100 is increased, and light at a wide angle from the micro LED die 120 are restricted, thereby achieving a desired type of light field and facilitating a light uniformity of the micro LED display device 100.

In some embodiments, a material of the funnel-tube structure 140 can be a negative photoresist, titanium dioxide, or quantum dots (QDs), the manufacturing method of which can use a photolithography technique (described in FIG. 3 to FIG. 12) to form an opening O1 between two neighboring funnel-tube structures 140, thereby forming the array of the funnel-tube structures 140. Neighboring funnel-tube structures 140 can be formed by red, green, and blue photoresists (described in FIG. 3 to FIG. 7), or be formed by filling red, green, and blue quantum dots into etched photoresist (described in FIG. 8 to FIG. 12). In some embodiments, the micro LED dies 120 may include red micro LED dies, green micro LED dies, and blue micro LED dies. The funnel-tube structure 140 is transparent and has a refractive index in a range from 1.5 to 2, thereby facilitating to transmit light upward. Furthermore, in some embodiments, the micro LED dies 120 are all blue micro LED dies, and the funnel-tube structures 140 include red photoresist, green photoresist, and blue photoresist.

In some embodiments, a lengthwise axis Z of the funnel-tube structure 140 may pass through the center of the micro LED die 120, such that the funnel-tube structure 140 is aligned with the micro LED die 120. Moreover, the funnel-tube structure 140 may directly contact a top surface of the protection layer 130, and the protection layer 130 is located between the funnel-tube structure 140 and the micro LED die 120.

The micro LED display device 100 further includes a cover 150, which serves as an upper substrate of the micro LED display device 100, and can protect the funnel-tube structure 140 and prevent the funnel-tube structure 140 from being contaminated.

It is to be noted that connections and relationships between elements, materials, and functions already described are not repeated below. In the following description, a method of manufacturing the micro LED display device 100 of FIG. 2 is to be explained.

Figure 3:
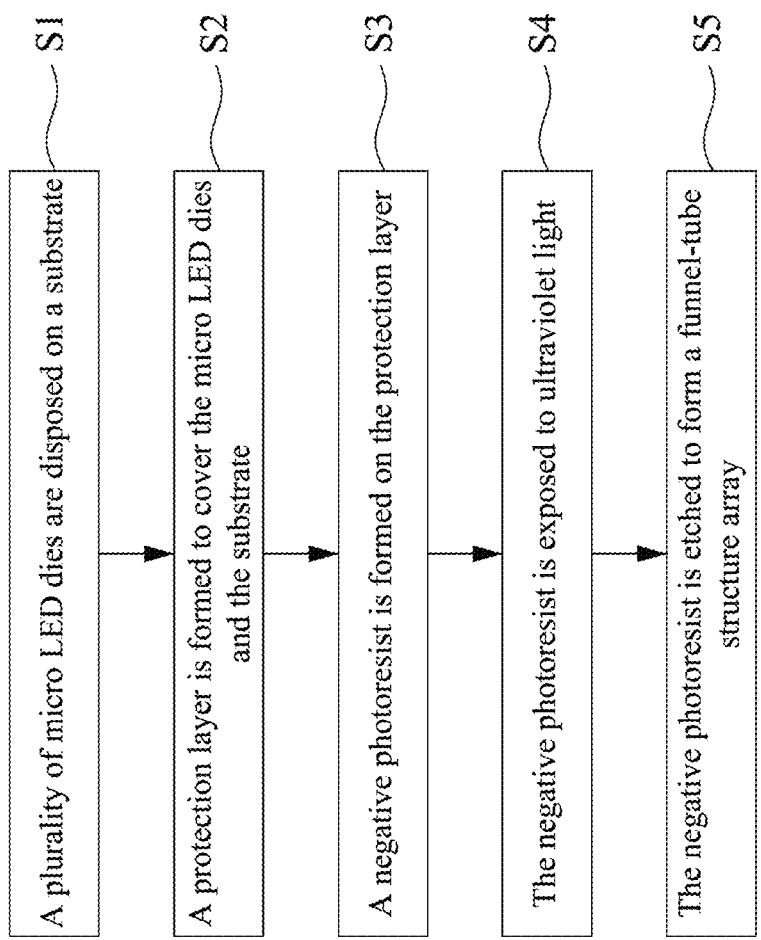
FIG. 3 shows a flowchart of a method of manufacturing a micro LED display device according to some embodiments of the present disclosure.

FIG. 3 shows a flowchart of a method of manufacturing a micro LED display device according to some embodiments of the present disclosure. In step S1, a plurality of micro LED dies are disposed on a substrate. Then in step S2, a protection layer is formed to cover the micro LED dies and the substrate. Then in step S3, a negative photoresist is formed on the protection layer. Then in step S4, the negative photoresist is exposed to ultraviolet light. Then in step S5, the negative photoresist is etched to form a funnel-tube structure array. In some embodiments, the method of manufacturing the micro LED display device is not limited to the above steps S1 to S5, and can further include other steps between two of the above steps, or steps S1 to S5 can each include multiple detailed steps. In the following description, each step of the method of manufacturing the abovementioned micro light emitting display device is to be explained.

Figure 4:
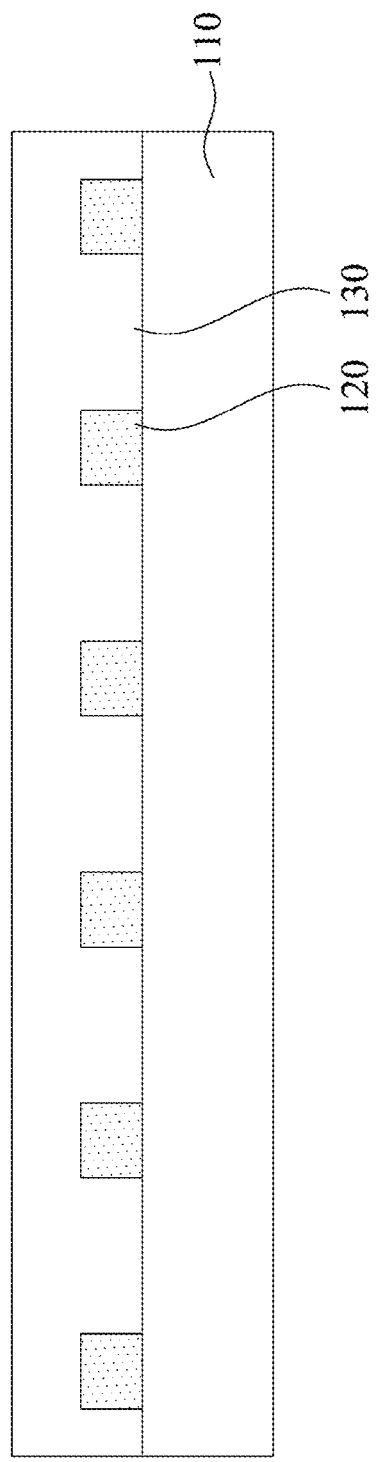
FIG. 4, FIG. 5, and FIG. 7 show cross-sectional views of intermediate steps of the method of manufacturing the micro LED display device of FIG. 3.
Figure 5:
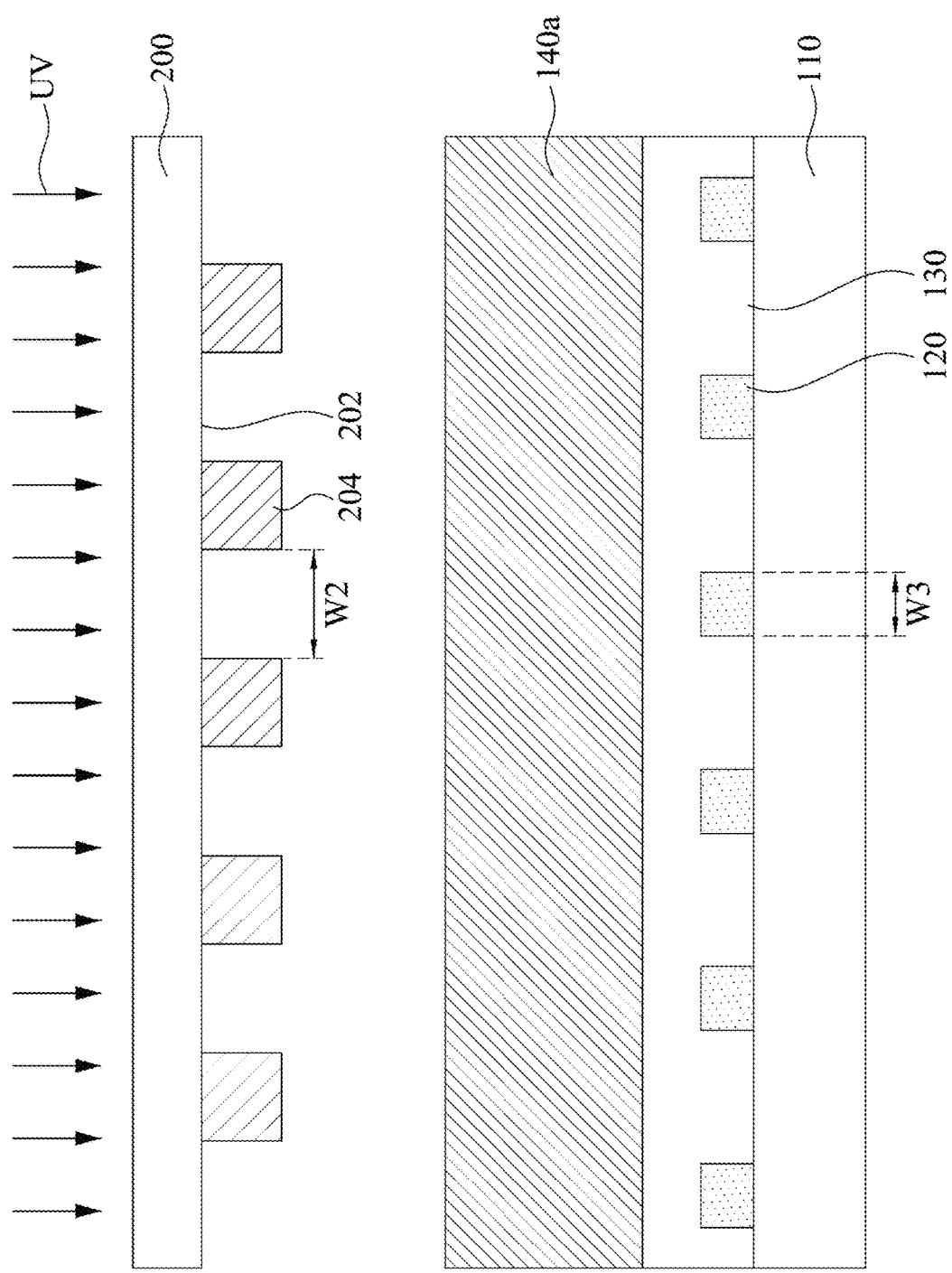
Figure 7:
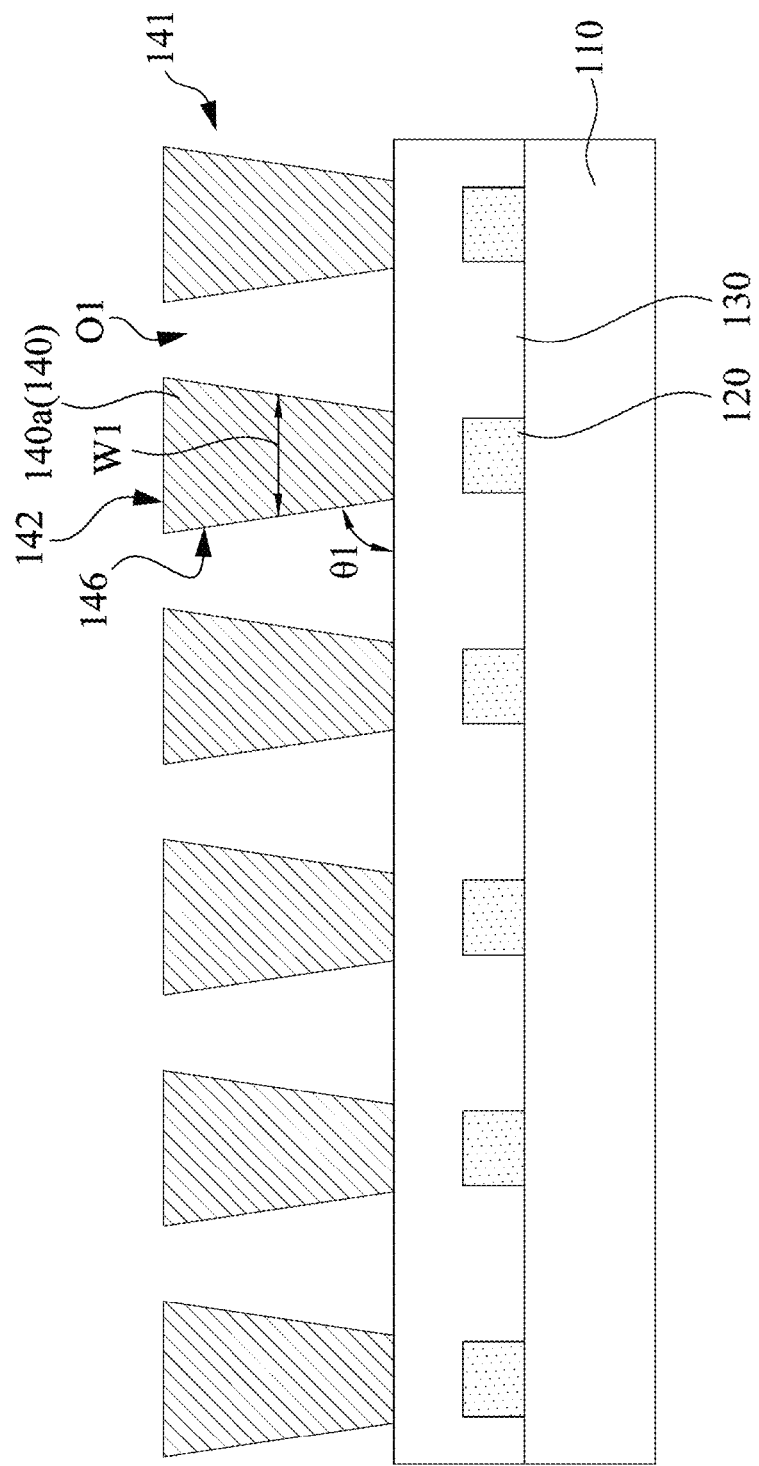

FIG. 4, FIG. 5, and FIG. 7 show cross-sectional views of intermediate steps of the method of manufacturing the micro LED display device of FIG. 3. Referring to FIG. 4, the micro LED die 120 can be located on the substrate 110 by a method of transferring, the micro LED dies 120 on the substrate 110 may be of the same color (such as blue) or different colors (such as red, green, and blue), and the arrangement of the micro LED dies 120 may be determined as deemed necessary by design. After the micro LED dies 120 are located on the substrate 110, the protection layer 130 may be formed to cover the micro LED dies 120 and the substrate 110.

Referring to FIG. 4 and FIG. 5, after forming the protection layer 130, a negative photoresist 140a can be formed on the protection layer 130. A thickness of the micro LED dies 120 may be about 7 μm. A thickness of the protection layer 130 being close to the thickness of the micro LED dies 120 has a positive effect on the light emitting efficiency. In some embodiments, the negative photoresist 140a may be formed on the protection layer 130 by spin coating. Then, the negative photoresist 140a can be exposed to ultraviolet light UV. In this step, a photomask 200 can be placed near the top surface of the negative photoresist 140a, and allow the ultraviolet light UV to pass through a plurality of translucent regions 202 of the photomask 200, thereby exposing the negative photoresist 140a to light. The translucent regions 202 of the photomask 200 respectively align with the micro LED dies 120 in a vertical direction, and a width W2 of each of the translucent regions 202 is greater than or equal to a width W3 of each of the micro LED dies 120, such that the negative photoresist 140a above the micro LED dies 120 are preserved in subsequent steps. Additionally, a material of the photomask 200 may be glass, but is not limited thereto. The negative photoresist 140a may be transparent, and may have a refractive index of 1.79, but the present disclosure is not limited in this regard.

Figure 6:
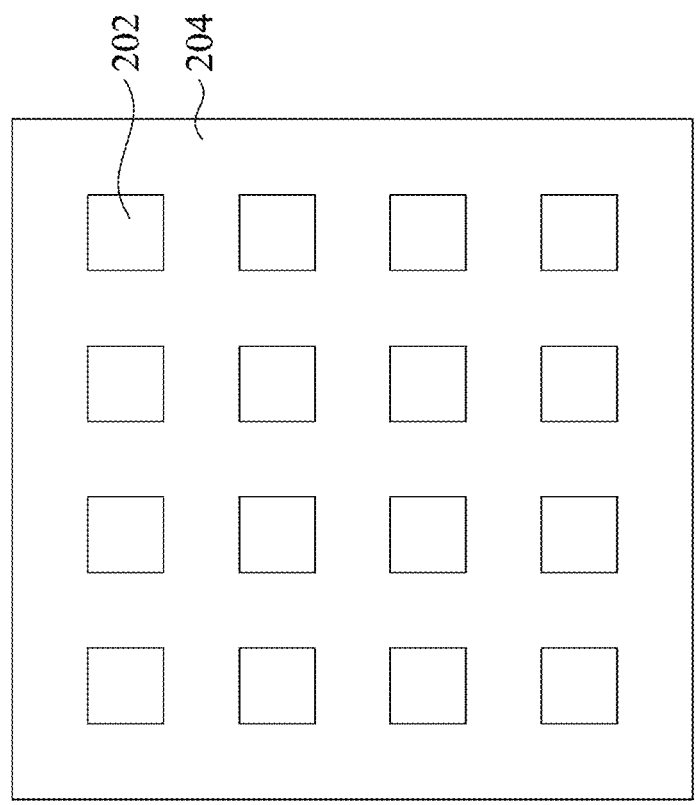
FIG. 6 shows a bottom view of a photomask of FIG. 5.

FIG. 6 shows a bottom view of the photomask 200 of FIG. 5. Referring to FIG. 5 and FIG. 6, a light shielding region 204 of the photomask 200 surrounds the translucent regions 202. The ultraviolet light UV can pass through the translucent regions 202 of the photomask 200, but is blocked by the light shielding region 204. A strength of the ultraviolet light UV decreases from a center of the translucent region 202 toward the light shielding region 204. A region of the negative photoresist 140a exposed to light through the translucent region 202 of the photomask 200 is insoluble, and a region of the negative photoresist 140a not exposed to light through the translucent region 202 of the photomask 200 is soluble. The above step can be performed by contact exposure. When the ultraviolet light UV passes through the translucent regions 202 of the photomask 200, a diffraction effect occurs.

Referring to FIG. 7, after exposing and developing the negative photoresist 140a, the negative photoresist 140a can be etched. Due to the diffraction effect, an edge (a sidewall) of the exposed and developed negative photoresist 140a is not perpendicular to the protection layer 130, such that the funnel-tube structure 140 can be formed. Neighboring funnel-tube structures 140 may be formed by red, green, and blue negative photoresist 140a. After the step of etching the negative photoresist 140a, the negative photoresist 140a can have the sloped edge 146, and the acute angle θ1 is included between the sloped edge 146 and the protection layer 130. The acute angle θ1 may be in a range from 45 degrees to 85 degrees.

After the above steps, the funnel-tube structure array 141 made of the negative photoresist 140a may be formed on the protection layer 130, wherein the funnel-tube structures 140 respectively overlap the micro LED dies 120 in a vertical direction, and the width W1 of each of the funnel-tube structures 140 is gradually increased from the protection layer 130 toward the top surface 142 of the funnel-tube structure 140. In other words, the width W1 of the funnel-tube structure 140 is increased in a direction away from the micro LED die 120 (upward). Using slit diffraction effect combined with semiconductor manufacturing techniques, the array of the funnel-tube structures 140 can be made. The manufacturing method of the present disclosure related to the funnel-tube structure 140 can be applied to mass production, and has advantages of simple fabrication and low cost.

After forming the funnel-tube structures 140, the cover 150 (see FIG. 2) can be disposed on the funnel-tube structures 140 of FIG. 7, so as to obtain the micro LED display device 100 of FIG. 2.

It is to be noted that connections and relationships between elements, materials, and functions already described are not repeated below. In the following description, another method of manufacturing the micro LED display device 100 of FIG. 2 is to be explained.

Figure 8:
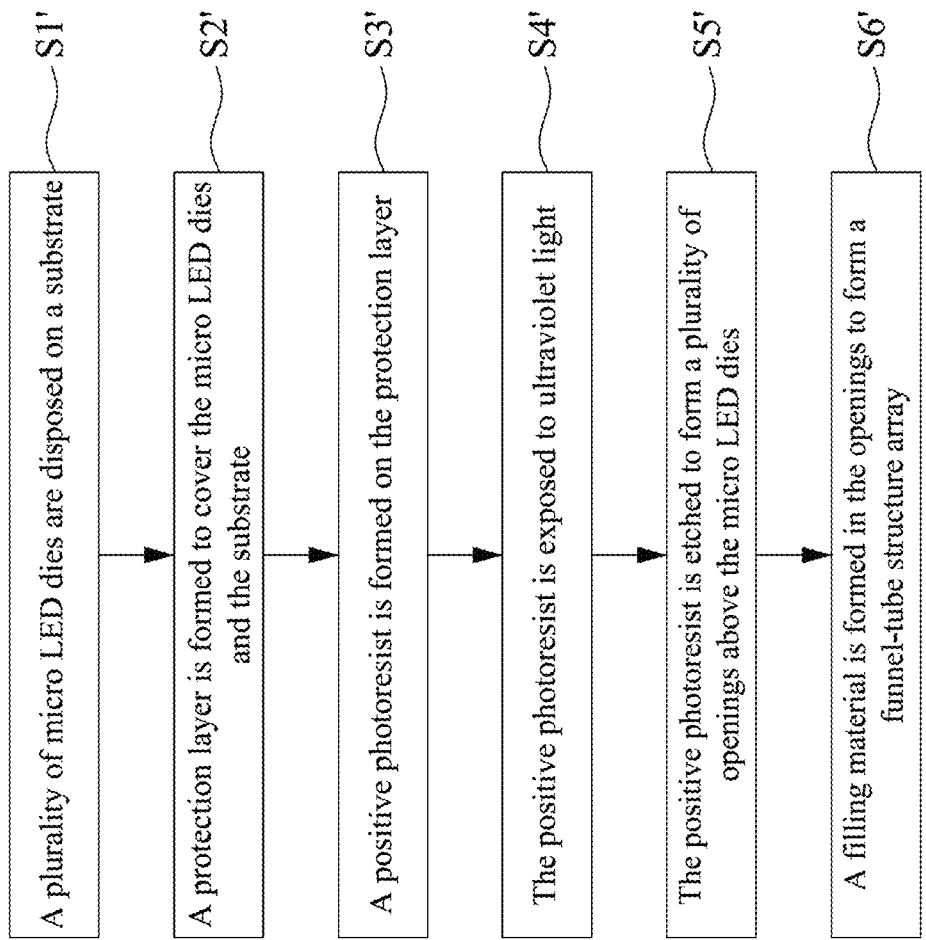
FIG. 8 shows a flowchart of a method of manufacturing a micro LED display device according to other embodiments of the present disclosure.

FIG. 8 shows a flowchart of a method of manufacturing a micro LED display device according to other embodiments of the present disclosure. In step S1', a plurality of micro LED dies are disposed on a substrate. Then in step S2', a protection layer is formed to cover the micro LED dies and the substrate. Then in step S3', a positive photoresist is formed on the protection layer. Then in step S4', the positive photoresist is exposed to ultraviolet light. Then in step S5', the positive photoresist is etched to form a plurality of openings above the micro LED dies. Then in step S6', a filling material is formed in the openings to form a funnel-tube structure array. In some embodiments, the method of manufacturing the micro LED display device is not limited to the above steps S1' to S6', and can further include for example other steps between two of the above steps, or steps S1 to S5 can each include multiple detailed steps. In the following description, each step of the method of manufacturing the abovementioned micro light emitting display device is to be explained.

Figure 9:
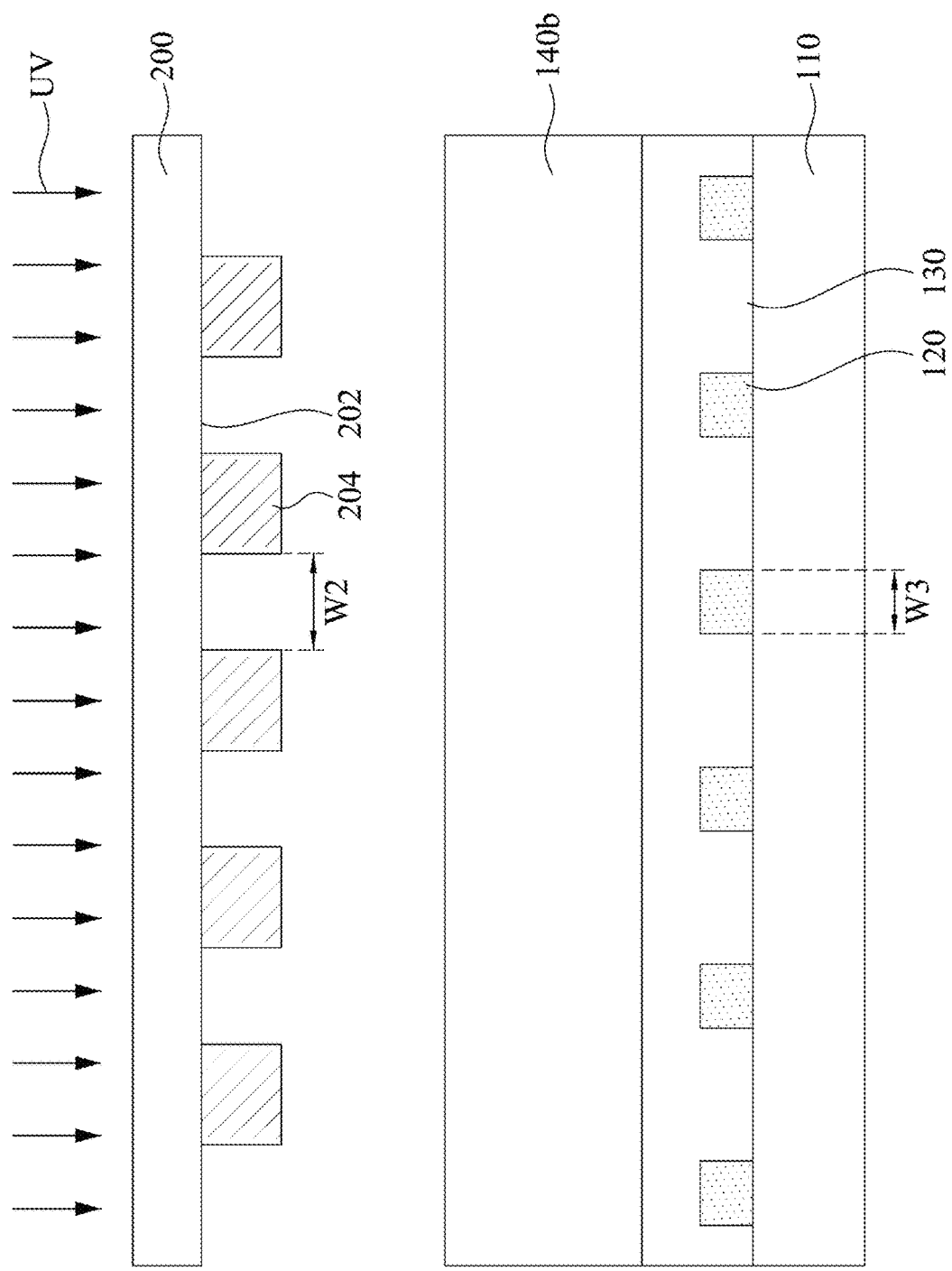
FIG. 9 to FIG. 12 show cross-sectional views of intermediate steps of the method of manufacturing the micro LED display device of FIG. 8.

FIG. 9 to FIG. 12 show cross-sectional views of intermediate steps of the method of manufacturing the micro LED display device of FIG. 8. Referring to FIG. 9, the method of forming the micro LED dies 120, the protection layer 130, and the substrate 110 is similar to the method of FIG. 4. The micro LED die 120 may be located on the substrate 110 by a method of transferring, the micro LED dies 120 on the substrate 110 may be of the same color (such as blue) or different colors (such as red, green, and blue), and the arrangement of the micro LED dies 120 may be determined as deemed necessary by design. After the micro LED dies 120 are located on the substrate 110, the protection layer 130 can be formed to cover the micro LED dies 120 and the substrate 110.

After forming the protection layer 130, a positive photoresist 140b can be formed on the protection layer 130. In some embodiments, the positive photoresist 140b can be formed on the protection layer 130 by spin coating. Then, the positive photoresist 140b can be exposed to ultraviolet light UV. In this step, a photomask 200 can be placed near the top surface of the positive photoresist 140b, and allow the ultraviolet light UV to pass through a plurality of translucent regions 202 of the photomask 200, thereby exposing the positive photoresist 140b to light. The translucent regions 202 of the photomask 200 respectively align with the micro LED dies 120 in a vertical direction, and a width W2 of each of the translucent regions 202 is greater than or equal to a width W3 of each of the micro LED dies 120, such that the positive photoresist 140b directly above the micro LED dies 120 is removed in subsequent steps. Additionally, a material of the photomask 200 may be glass, but is not limited thereto. The positive photoresist 140b may be transparent, but the present disclosure is not limited in this regard.

The photomask 200 of FIG. 9 has a same bottom view as that of FIG. 6. Referring to FIG. 6 and FIG. 9, the light shielding region 204 of the photomask 200 surrounds the translucent regions 202. The ultraviolet light UV can pass through the translucent regions 202 of the photomask 200, but is blocked by the light shielding region 204. A strength of the ultraviolet light UV decreases from a center of the translucent region 202 toward the light shielding region 204. A region of the positive photoresist 140b exposed to light through the translucent region 202 of the photomask 200 is soluble, and a region of the positive photoresist 140b not exposed to light through the translucent region 202 of the photomask 200 is insoluble. The above step may be performed by contact exposure. When the ultraviolet light UV passes through the translucent regions 202 of the photomask 200, a diffraction effect occurs.

Figure 10:
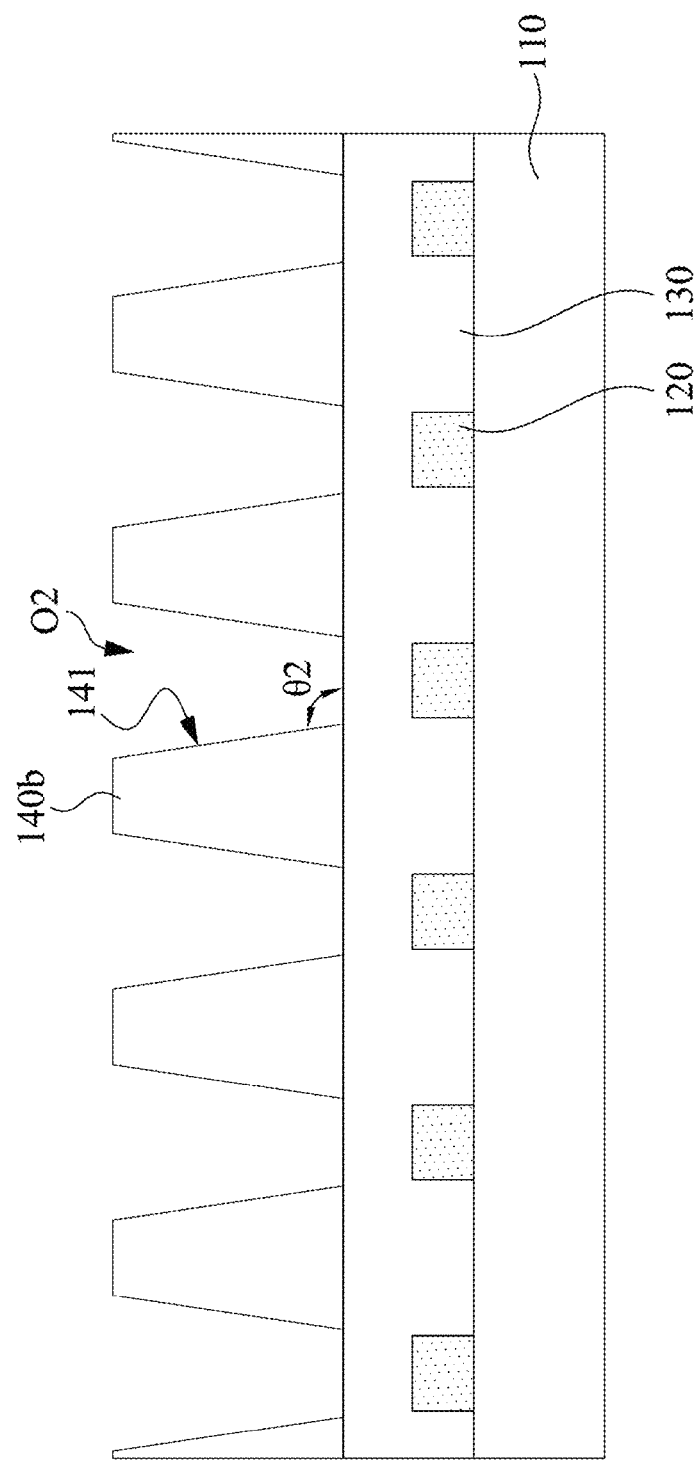

Referring to FIG. 10, after exposing and developing the positive photoresist 140b, the positive photoresist 140b can be etched to form openings O2 above the micro LED dies 120. Due to the diffraction effect, an edge (a sidewall) of the exposed and developed positive photoresist 140b is not perpendicular to the protection layer 130, such that the positive photoresist 140b can have a sloped edge 141. An obtuse angle θ2 is included between the sloped edge 141 and the protection layer 130. The obtuse angle θ2 can be in a range from 95 degrees to 135 degrees.

Figure 11:
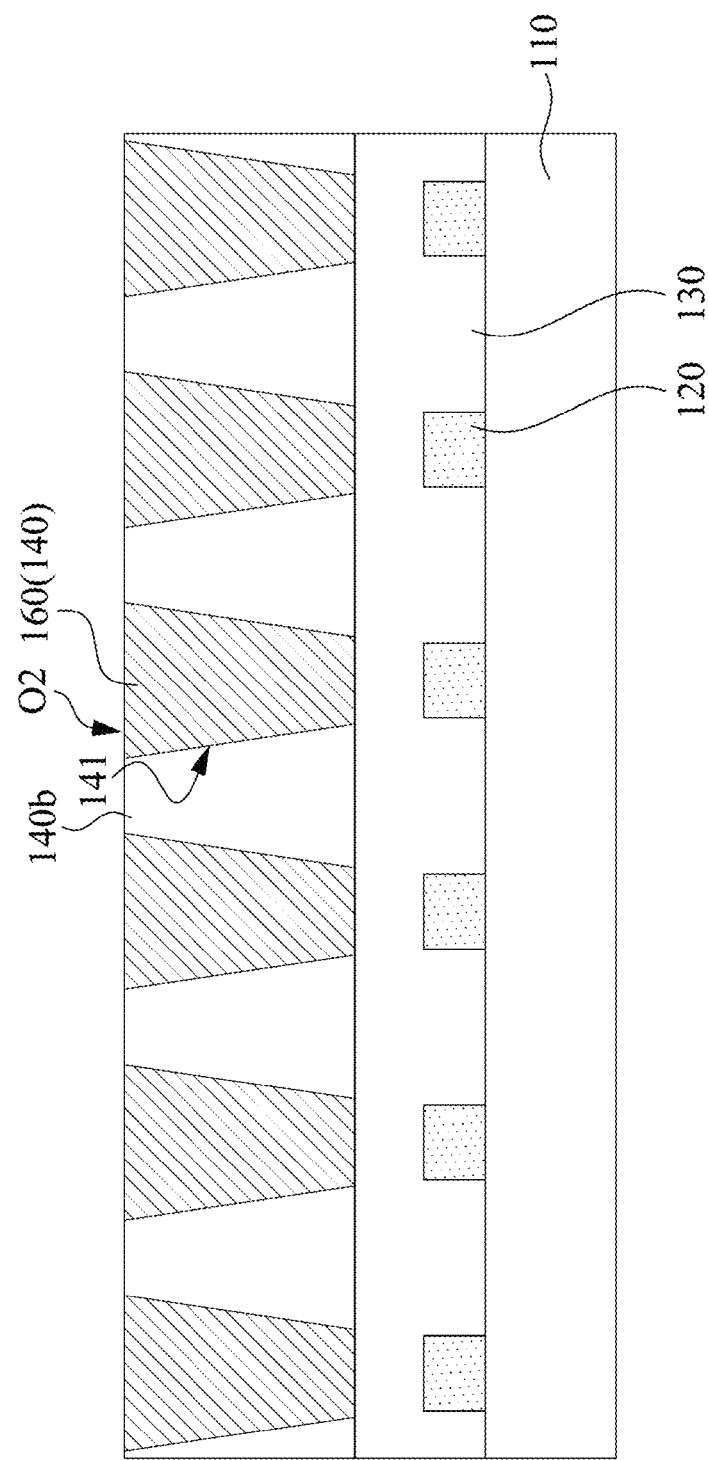

Referring to FIG. 10 and FIG. 11, after the openings O2 of the positive photoresist 140b are formed, a filling material 160 can be formed in the openings O2 of the positive photoresist 140b. In some embodiments, the filling material 160 includes titanium dioxide or quantum dots. The filling material 160 may form the funnel-tube structure 140 in subsequent steps. The quantum dots can improve the color rendering and increase the light emitting efficiency. Neighboring funnel-tube structures 140 can be formed by filling red, green, and blue quantum dots after etching the positive photoresist 140b. In other embodiments, the designer can select an appropriate filling material 160 as the funnel-tube structure 140, thereby increasing the flexibility of the material selection.

Figure 12:
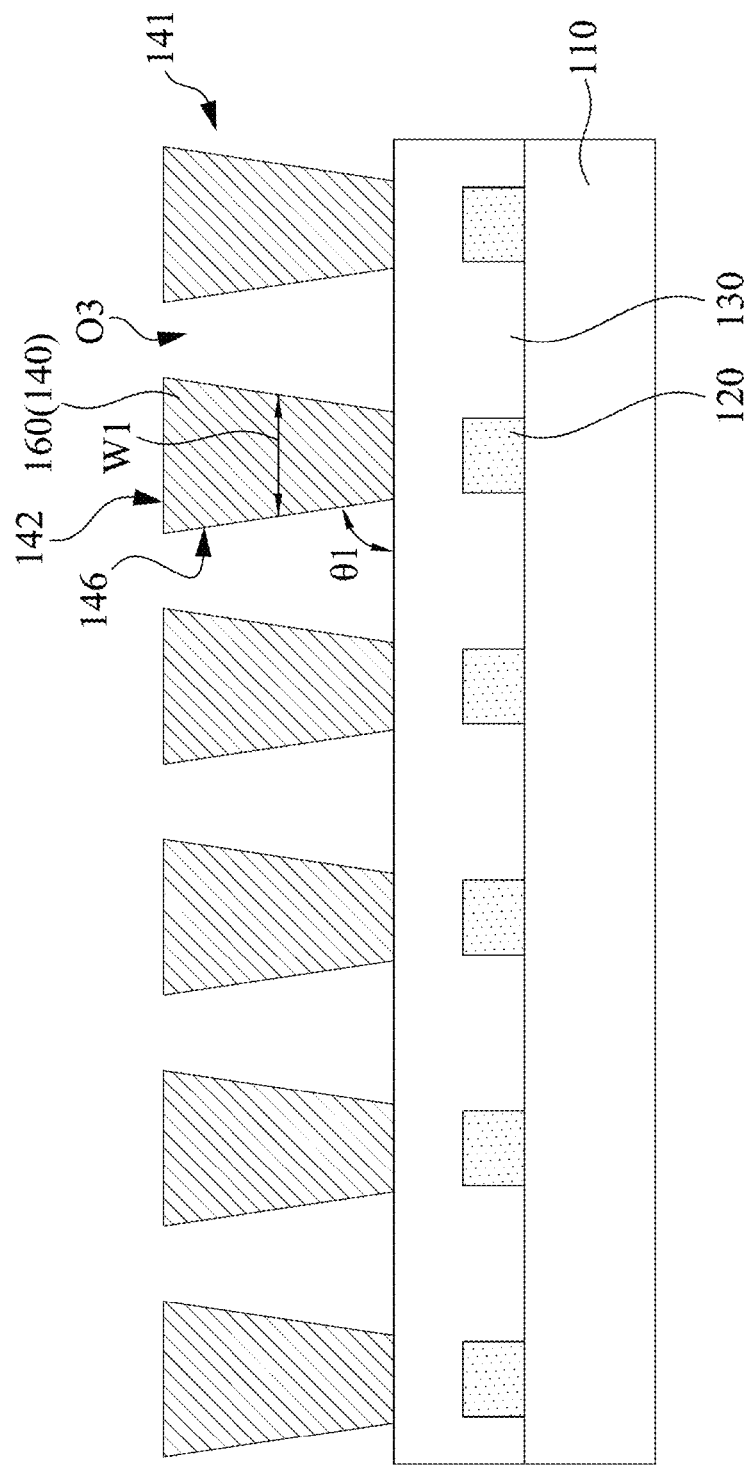

Referring to FIG. 11 and FIG. 12, after forming the filling material 160 in the openings O2 of the positive photoresist 140b, the positive photoresist 140b can be removed, such that two neighboring filling materials 160 have an opening O3 therebetween. Due to the sloped edge 141 of the positive photoresist 140b of FIG. 11, the filling material 160 may have a sloped edge 146 after filling the filling material 160 in the positive photoresist 140b, an acute angle θ1 is included between the sloped edge 146 and the protection layer 130. The acute angle θ1 may be in a range from 45 degrees to 85 degrees, and is supplementary with the obtuse angle θ2 of FIG. 10.

After the above steps, the funnel-tube structure array 141 made of the filling material 160 (such as titanium dioxide or quantum dots) can be formed on the protection layer 130, wherein the funnel-tube structures 140 respectively overlap the micro LED dies 120 in a vertical direction, and the width W1 of the funnel-tube structure 140 is gradually increased from the protection layer 130 toward the top surface 142 of the funnel-tube structure 140. In other words, the width W1 of the funnel-tube structure 140 is increased in a direction away from the micro LED die 120 (upward). Using slit diffraction effect combined with semiconductor manufacturing techniques, the array of the funnel-tube structures 140 can be made. The manufacturing method of the present disclosure related to the funnel-tube structure 140 can be applied to mass production, and has advantages of simple fabrication and low cost.

After forming the funnel-tube structures 140, the cover 150 (see FIG. 2) may be disposed on the funnel-tube structures 140 of FIG. 12, so as to obtain the micro LED display device 100 of FIG. 2.

Figure 13:
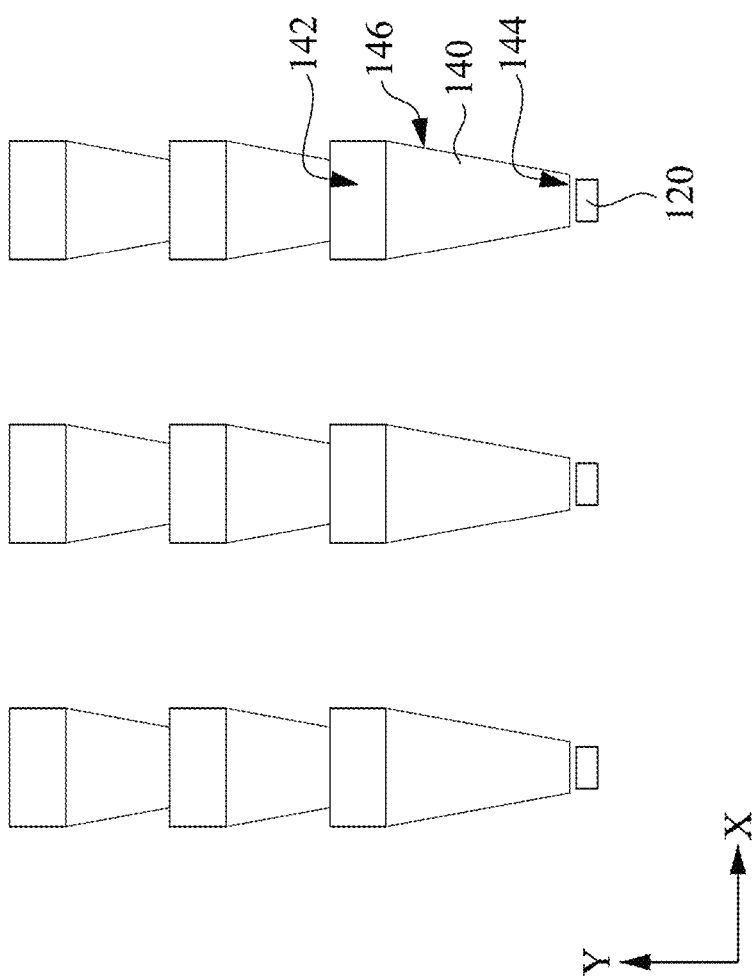
FIG. 13 shows a perspective view of funnel-tube structures and an array of micro LED dies array according to some embodiments of the present disclosure.

FIG. 13 shows a perspective view of the funnel-tube structures 140 and an array of the micro LED dies 120 according to some embodiments of the present disclosure. In some embodiments, the funnel-tube structures 140 and the micro LED dies 120 are arranged in a 3×3 array, but the present disclosure is not limited thereto. The funnel-tube structures 140 and the micro LED dies 120 are arranged in an X direction and a Y direction. Each of the funnel-tube structures 140 has the sloped edge 146 and the opposite top surface 142 and bottom surface 144. The sloped edge 146 is located between the top surface 142 and the bottom surface 144, and adjoins the top surface 142 and the bottom surface 144. The bottom surface 144 of the funnel-tube structure 140 faces toward the micro LED die 120, and the top surface 142 of the funnel-tube structure 140 faces away from the micro LED die 120. The top surface 142 and the bottom surface 144 of the funnel-tube structure 140 may be rectangular (such as square). In some embodiments, dimensions (such as width or area) of the top surface 142 of the funnel-tube structure 140 are greater than those of the micro LED die 120. Dimensions (such as width or area) of the bottom surface 144 of the funnel-tube structure 140 are greater than or equal to those of the micro LED die 120.

Figure 14:
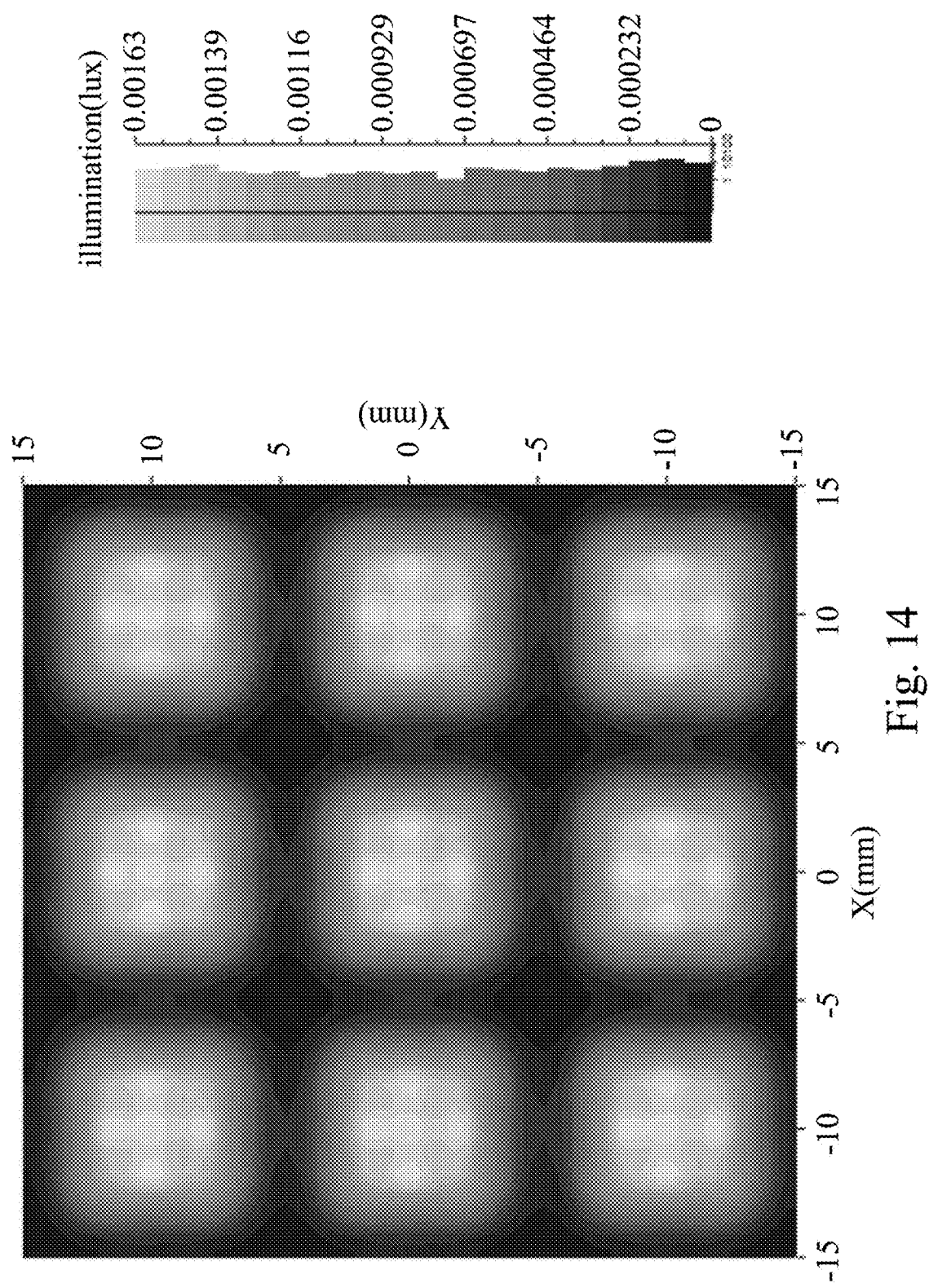
FIG. 14 shows an illumination distribution of the funnel-tube structures and the array of the micro LED dies of FIG. 13.

FIG. 14 shows an illumination distribution of the funnel-tube structures 140 and the array of the micro LED dies 120 of FIG. 13. Referring to FIG. 13 and FIG. 14, the funnel-tube structures 140 respectively stand on the micro LED dies 120, thereby creating functions similar to pixels. Compared with vertical structures, the funnel-tube structures 140 can better enhance light uniformity of the micro LED dies 120, and increases the light emitting efficiency. It can be seen from FIG. 14, that the illumination distribution of the funnel-tube structures 140 and the array of the micro LED dies 120 is very uniform.

In summary of the above, because the micro LED display device has the funnel-tube structures located on the protection layer, and the widths of the funnel-tube structures are gradually increased from the protection layer toward the top surfaces of the funnel-tube structures, when the micro LED dies under the funnel-tube structure emit light, the light emitted by the micro LED dies can enter the funnel-tube structures and be totally internally reflected at the sloped edges of the funnel-tube structures. As a result, a light emitting efficiency of the micro LED display device can be increased, and light at a wide angle from the micro LED die is restricted, thereby achieving a desired type of light field and facilitating a light uniformity of the micro LED display device. Additionally, the method of manufacturing the micro LED display device can form the funnel-tube structures made of the negative photoresist or the filling material on the protection layer. Using slit diffraction combined with semiconductor fabrication techniques, an array of the funnel-tube structures can be made. The method of manufacturing the micro LED display device can be applied to mass production, and has advantages of simple fabrication and low cost.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A micro light emitting diode (LED) display device, comprising:
   a substrate;
   a plurality of micro LED dies located on the substrate;
   a protection layer covering the micro LED dies and the substrate; and
   a funnel-tube structure array located on the protection layer, and comprising a plurality of funnel-tube structures, wherein each of the funnel-tube structures has a top surface facing away from the protection layer, the funnel-tube structures respectively overlap the micro LED dies in a vertical direction, and widths of the funnel-tube structures are gradually increased from the protection layer to the top surfaces of the funnel-tube structures, and a refractive index of the protection layer is smaller than a refractive index of the funnel-tube structures.

2. The micro LED display device of claim 1, wherein each of the funnel-tube structures has a sloped edge, an acute angle is included between the sloped edge and the protection layer, and the acute angle is in a range from 45 degrees to 85 degrees.

3. The micro LED display device of claim 1, wherein a material of the funnel-tube structures comprises negative photoresist.

4. The micro LED display device of claim 1, wherein the micro LED dies comprise a red micro LED die, a green micro LED die, and a blue micro LED die, and the funnel-tube structures are transparent and have the refractive index in a range from 1.5 to 2.

5. The micro LED display device of claim 1, wherein the micro LED dies are blue micro LED dies, and the funnel-tube structures comprise a red photoresist, a green photoresist, and a blue photoresist.

6. The micro LED display device of claim 1, wherein a material of the funnel-tube structures comprises titanium dioxide or quantum dots (QDs).

7. The micro LED display device of claim 1, wherein areas of the top surfaces of the funnel-tube structures are greater than areas of bottom surfaces of the funnel-tube structures.

8. The micro LED display device of claim 1, wherein lengthwise axes of the funnel-tube structures respectively pass through centers of the micro LED dies.

9. The micro LED display device of claim 1, wherein the funnel-tube structures directly contact the protection layer.

10. The micro LED display device of claim 1, wherein the protection layer is located between the funnel-tube structures and the micro LED dies.

11. A method of manufacturing a micro LED display device, comprising:
   disposing a plurality of micro LED dies on a substrate;
   forming a protection layer covering the micro LED dies and the substrate; and
   forming a funnel-tube structure array having a plurality of funnel-tube structures on the protection layer, wherein the funnel-tube structures respectively overlap the micro LED dies in a vertical direction, and widths of the funnel-tube structures are gradually increased from the protection layer to top surfaces of the funnel-tube structures, and a refractive index of the protection layer is smaller than a refractive index of the funnel-tube structures.

12. The method of claim 11, wherein forming the funnel-tube structure array on the protection layer comprises:
   forming a negative photoresist on the protection layer;
   exposing the negative photoresist to ultraviolet light; and
   etching the negative photoresist to form the funnel-tube structure array.

13. The method of claim 12, wherein exposing the negative photoresist to the ultraviolet light comprises:
   passing the ultraviolet light through a plurality of translucent regions of a photomask, wherein the translucent regions respectively align with the micro LED dies in a vertical direction, and a width of each of the translucent regions is greater than or equal to a width of each of the micro LED dies.

14. The method of claim 13, further comprising:
   placing the photomask near a top surface of the negative photoresist.

15. The method of claim 12, wherein etching the negative photoresist is performed such that the negative photoresist has a sloped edge, and an acute angle is included between the sloped edge and the protection layer.

16. The method of claim 11, wherein forming the funnel-tube structure array on the protection layer comprises:
   forming a positive photoresist on the protection layer;
   exposing the positive photoresist to ultraviolet light;
   etching the positive photoresist to form a plurality of openings above the micro LED dies; and
   forming a filling material in the openings of the positive photoresist to form the funnel-tube structure array.

17. The method of claim 16, wherein exposing the positive photoresist to ultraviolet light comprises:
   passing the ultraviolet light through a plurality of translucent regions of a photomask, wherein the translucent regions respectively align with the micro LED dies in a vertical direction, and a width of each of the translucent regions is greater than or equal to a width of each of the micro LED dies.

18. The method of claim 17, further comprising:
   placing the photomask near a top surface of the positive photoresist.

19. The method of claim 16, further comprising:
   after forming the filling material in the openings of the positive photoresist, removing the positive photoresist.

20. The method of claim 16, wherein etching the positive photoresist is performed such that the positive photoresist has a sloped edge, and an obtuse angle is included between the sloped edge and the protection layer.

* * * * *